(12) United States Patent
Huang

(10) Patent No.: US 8,816,361 B1
(45) Date of Patent: Aug. 26, 2014

(54) STRUCTURE COMBINING SOLAR CELL AND LIGHT EMITTING ELEMENT

(71) Applicant: Phecda Technology Co., Ltd, Taipei (TW)

(72) Inventor: Yong-Fa Huang, Zhunan Township, Miaoli County (TW)

(73) Assignee: Phecda Technology Co. Ltd., Taipei (TW)

( * ) Notice: Subject to any disclaimer, the term of this patent is extended or adjusted under 35 U.S.C. 154(b) by 0 days.

(21) Appl. No.: 13/918,325

(22) Filed: Jun. 14, 2013

(30) Foreign Application Priority Data

Apr. 11, 2013 (TW) .............................. 102112940 U

(51) Int. Cl.
*H01L 31/153* (2006.01)
*H01L 31/167* (2006.01)
*H01L 31/052* (2014.01)
*H01L 31/0236* (2006.01)
*H01L 31/14* (2006.01)
*H01L 31/0232* (2014.01)

(52) U.S. Cl.
CPC .......... *H01L 31/167* (2013.01); *H01L 31/0527* (2013.01); *H01L 31/02366* (2013.01); *H01L 31/153* (2013.01); *H01L 31/143* (2013.01); *H01L 31/02327* (2013.01)
USPC ................. 257/82; 257/E31.099; 257/E31.13

(58) Field of Classification Search
CPC ............................ H01L 31/143; H01L 31/153
USPC ..................................................... 257/E31.099
See application file for complete search history.

(56) References Cited

U.S. PATENT DOCUMENTS

| | | | |
|---|---|---|---|
| 2008/0123328 A1* | 5/2008 | Lai et al. ........................ | 362/183 |
| 2012/0138124 A1* | 6/2012 | Shmueli et al. ................ | 136/247 |
| 2012/0298953 A1* | 11/2012 | Sim ................................. | 257/13 |
| 2012/0313113 A1* | 12/2012 | Chen et al. ...................... | 257/84 |

* cited by examiner

*Primary Examiner* — Stephen W Smoot
(74) *Attorney, Agent, or Firm* — Muncy, Geissler, Olds & Lowe, P.C.

(57) ABSTRACT

Disclosed is a structure combining a solar cell and a light-emitting element. The structure includes a light-emitting device having a substrate and a light-emitting structure disposed on the first surface of the substrate. The substrate includes a plurality of cones formed on a second surface opposite to the first surface. The structure also includes a first conductive layer, disposed on the second surface, a power convention layer disposed on the first conductive layer, a second conductive layer disposed on the power conversion layer, and a patterned transparent layer disposed on the second conductive layer. The patterned transparent layer includes a surface consisting of a plurality of cones and disposed on a side opposite to the second conductive layer.

7 Claims, 1 Drawing Sheet

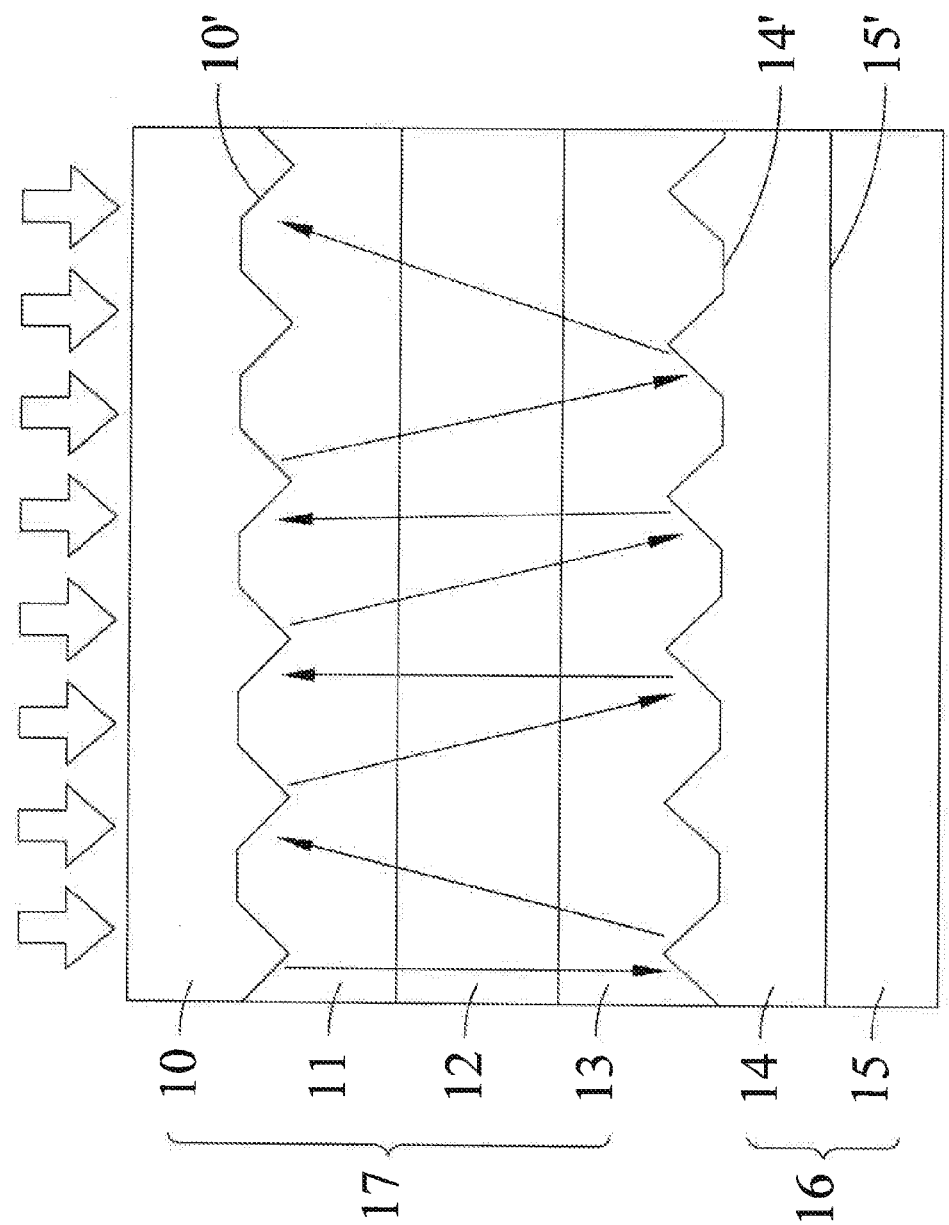

STRUCTURE COMBINING SOLAR CELL AND LIGHT EMITTING ELEMENT

CROSS-REFERENCE TO RELATED APPLICATION

This application claims the benefit of Taiwan Patent Application No. 102112940, field on Apr. 11, 2013, in the Taiwan Intellectual Property Office, the disclosure of which is incorporated herein in its entirety by reference.

BACKGROUND OF THE INVENTION

1. Field of the Invention

The present invention relates to a structure combining a solar cell with a light emitting element, and more particularly to the technology of integrating a solar cell and a light emitting element into a single structure.

2. Description of the Related Art

Unlike conventional light sources, light emitting diode (LED) has the effects of emitting cold light, consuming less power, and providing a longer service life and a quick response without requiring any warm-up time, when a forward bias voltage is applied to the LED.

Since solar energy has the advantages of being independent of location, free of pollutions, and everlasting, therefore solar energy is usually used in LED applications. For example, related manufacturers have used solar cells as a power source of LED road lamps. However, independent LED modules and independent solar cell modules are adopted, and then the two are electrically coupled with each other, and thus the performance of such design is still not good enough.

Therefore, solar cells and LEDs are combined into a single structure to provide the aforementioned advantages of both of the LEDs and solar energy, and then a structure with a patterned sapphire substrate is used to improve the light absorption efficiency of the solar cell.

SUMMARY OF THE INVENTION

In view of the aforementioned problems of the prior art, it is a primary objective of the present invention to provide a structure combining a solar cell with a light emitting element, and the structure is applicable for supplying electric power generated by the solar cell to the light emitting element to emit light, and a patterned substrate is used for improving the light absorption efficiency of the solar cell.

To achieve the aforementioned objective, the present invention provides a structure combining a solar cell and a light emitting element, and the structure comprises a light emitting element, a first conductive layer, a power conversion layer, a second conductive layer, a patterned transparent layer. The light emitting element comprises a substrate and a light emitting structure, and the light emitting structure is disposed on a first surface of substrate, and the substrate has a plurality of cones disposed on a first surface opposite to the second surface to form a patterned surface. The first conductive layer is disposed on the second surface. The power conversion layer is disposed on the first conductive layer. The second conductive layer is disposed on the power conversion layer. The patterned transparent layer is disposed on the second conductive layer, and the patterned sapphire transparent layer comprises a surface consisting of a plurality of cones and disposed on a side opposite to the second conductive layer.

Preferably, the cones are distributed on the substrate and the transparent layer uniformly.

Preferably, the cones on the substrate and the transparent layer are not contacted with one another.

Preferably, the first conductive layer and the second conductive layer are made of a transparent conductive material.

Preferably, the substrate and the patterned transparent layer are formed by a crystal growth technology.

Preferably, the substrate and the patterned transparent layer are made of gallium nitride (GaN), silicon (Si), silicon carbide (SiC), sapphire, or silicon dioxide ($SiO_2$).

Preferably, the cones are in a conical shape, a multi-facet conical shape or an irregular shape.

BRIEF DESCRIPTION OF THE DRAWINGS

FIG. 1 is a schematic view of a structure combining a solar cell and a light emitting element of the present invention.

DESCRIPTION OF THE PREFERRED EMBODIMENTS

The technical characteristics, contents, advantages and effects of the present invention will become apparent from the following detailed description taken with the accompanying drawing. The term "and/or" includes any one, combination, or all of the related items, which is similar to the expression of the term "at least one" of a series of elements, so that the whole series can be modified instead of modifying each element in the series.

The following will describe the combination of a solar cell and a light element according to the embodiment of the present invention.

With reference to FIG. 1 for a schematic view of a structure combining a solar cell and a light emitting element of the present invention, the structure comprises a light emitting element 16, a first conductive layer 13, a power conversion layer 12, a second conductive layer 11, and a patterned transparent layer 10, wherein the light emitting element 16 comprises a substrate 14 and a light emitting structure 15, and the light emitting structure 15 is disposed on a first surface 15' of the substrate 14. The substrate 14 is made of sapphire. The light emitting structure 15 is a conventional LED structure, or an organic light emitting diode (OLED) structure.

For example, the light emitting structure 15 of this embodiment is the LED structure and comprises a first semiconductor layer, a light emitting layer, a second semiconductor layer, a first ohmic electrode contacted with the first semiconductor layer, and a second ohmic electrode contacted with the second semiconductor layer, sequentially arranged on the first surface 15' of the substrate 14. The first semiconductor layer, the light emitting layer and the second semiconductor layer are made of Group III-V based semiconductors such as gallium nitride based semiconductors. The first and second ohmic electrodes are made of at least one alloy or multilayer film selected from the collection of nickel, lead, cobalt, iron, titanium, copper, rhodium, gold, ruthenium, tungsten, zirconium, molybdenum, tantalum, silver, and oxides and nitrides thereof. In addition, the first and second ohmic electrodes are made of at least one alloy or multilayer film selected from the collection of rhodium, iridium, silver and aluminum. The conventional LED or OLED structure is a prior art, and thus will not be described in details.

The substrate 14 has a plurality of cones disposed on a second surface 14' opposite to the first surface 15' to form a patterned surface. Wherein, the cones can be in a conical shape, a multi-faceted conical shape or an irregular shape capable of improving the reflection of light. In addition, the cones are preferably distributed on the second surface 14' uniformly. However, the invention is not limited to the aforementioned distribution, and any other appropriate distribution can be used instead. In addition, the cones are preferred not contacted with one another, in other words, the bottoms of the cones are not in contact with one another. In FIG. 1, the cones of this preferred embodiment are in a conical shape, uniformly distributed and not contacted with one another.

The first conductive layer 13, the power conversion layer 12, the second conductive layer 11, and the patterned transparent layer 10 are assembled to form a solar cell 17.

The first conductive layer 13 is coated onto the second surface 14'; the power conversion layer 12 is coated onto the first conductive layer 13; and the second conductive layer 11 is coated onto the power conversion layer 12. The patterned transparent layer 10 coated onto the second conductive layer 11 is a patterned sapphire transparent layer and has a surface 10' consisted of a plurality of cones, and the surface 10' is disposed on a side opposite to the second conductive layer 11. In other words, the surface 10' is situated in a direction facing the second conductive layer 11. Wherein, the cones can be in a conical shape, a multi-faceted conical shape or any irregular shape capable of improving the reflection of light. In addition, the cones are preferably distributed on the surface 10' uniformly. However, the invention is not limited to the aforementioned distribution, and any other appropriate distribution can be used instead. In addition, the cones are preferred not contacted with one another; in other words, the bottoms of the cones are not in contact with one another. In FIG. 1, the cones of this preferred embodiment are in a conical shape, uniformly distributed and not contacted with one another.

Wherein, the first conductive layer 13 and the second conductive layer 11 are made of a transparent conductive material, and the power conversion layer can be made of a material including but not limited to ethyl vinyl acetate.

During the use of the structure of a preferred embodiment of the present invention, firstly, sunlight is projected onto the solar cell 17, and particularly onto the patterned transparent layer 10 as shown in FIG. 1. Since the patterned transparent layer 10 and the second conductive layer 11 are made of a transparent material, therefore the sunlight can be projected onto the power conversion layer 12, and the power conversion layer 12 converts the projected sunlight into electric energy.

Since the light absorption efficiency of the light absorption efficiency of the conventional power conversion layer 12 is less than 100%, some of the remaining sunlight will be passed through the power conversion layer 12 and projected onto the second surface 14' of substrate 14. The second surface 14' is a surface with a plurality of cones and having a high reflectivity, so that the sunlight can be reflected to the power conversion layer 12 again to allow the power conversion layer 12 to generate electric power again.

Similarly, some of the sunlight reflected to the power conversion layer 12 will be projected onto the surface 10' of the patterned transparent layer 10, and the surface 10' is a surface with a plurality of cones to provide a high reflectivity, so that the sunlight can be reflected to the power conversion layer 12 again and allows the power conversion layer 12 to generate electric power again.

The aforementioned reflection process is repeated to absorb the sunlight projected from the exterior into the patterned transparent layer 10 by the power conversion layer 12 for several times for the power generation, so that the structural design of the patterned transparent layer 10 and the substrate 14 in accordance with the present invention can improve the light absorption efficiency of the solar energy. The electric power generated by the power conversion layer 12 can be supplied to the light emitting element 16 to emit light and produce illumination.

In addition, the structure combining a solar cell and a light emitting element of the present invention can be connected to a power storage module, if needed, for storing extra electric power generated by the solar cell 17.

The aforementioned is merely the example, not the limitation. While the means of specific embodiments in present invention has been described by reference drawings, numerous modifications and variations could be made thereto by those skilled in the art without departing from the scope and spirit of the invention set forth in the claims. The modifications and variations should in a range limited by the specification of the present invention.

What is claimed is:

1. A structure combining a solar cell and a light emitting element, comprising:
   a light emitting element, comprising a substrate and a light emitting structure, and the light emitting structure being disposed on a first surface of the substrate, and the substrate having a plurality of cones disposed on a second surface opposite to the first surface to form a patterned surface;
   a first conductive layer, disposed on the second surface;
   a power conversion layer, disposed on the first conductive layer, a second conductive layer, disposed on the power conversion layer; and
   a patterned transparent layer, disposed on the second conductive layer, and having a surface consisting of a plurality of cones corresponding to the patterned transparent layer and facing the second conductive layer.

2. The structure of claim 1, wherein the cones are distributed on the substrate and the patterned transparent layer uniformly.

3. The structure of claim 1, wherein the cones disposed on the substrate and the patterned transparent layer are not contacted with one another.

4. The structure of claim 1, wherein the first conductive layer and the second conductive layer are made of a transparent conductive material.

5. The structure of claim 1, wherein the substrate and the patterned transparent layer is made of gallium nitride (GaN), silicon (Si), silicon carbide (SiC), sapphire or silicon dioxide ($SiO_2$).

6. The structure of claim 1, wherein the cones are in a conical shape, a multi-facet conical shape or an irregular shape.

7. The structure of claim 1, wherein the light emitting element is a light emitting diode (LED), and the light emitting structure comprises a first semiconductor layer, a light emitting layer, a second semiconductor layer, a first ohmic electrode contacted with the first semiconductor layer, and a second ohmic electrode contacted with the second semiconductor layer.

* * * * *